(12) United States Patent
So et al.

(10) Patent No.: US 12,387,660 B2
(45) Date of Patent: Aug. 12, 2025

(54) DISPLAY DEVICE AND MANUFACTURING METHOD THEREOF

(71) Applicant: Samsung Display Co., LTD., Yongin-si (KR)

(72) Inventors: Myeong Su So, Yongin-si (KR); Tae Jin Kong, Yongin-si (KR); Seul Ki Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/362,099

(22) Filed: Jul. 31, 2023

(65) Prior Publication Data

US 2024/0233620 A1 Jul. 11, 2024

(30) Foreign Application Priority Data

Jan. 11, 2023 (KR) .................. 10-2023-0004267

(51) Int. Cl.
```
G09G 3/32     (2016.01)
G09G 3/20     (2006.01)
H10H 20/821   (2025.01)
H10H 20/822   (2025.01)
```

(52) U.S. Cl.
CPC ............. *G09G 3/32* (2013.01); *G09G 3/2092* (2013.01); *H10H 20/821* (2025.01); *H10H 20/822* (2025.01); *G09G 2300/0426* (2013.01)

(58) Field of Classification Search
CPC .................. G09G 3/32; G09G 3/2092; G09G 2300/0426; H01L 33/24; H01L 33/26; H01L 33/62; H01L 25/0753
See application file for complete search history.

(56) References Cited

U.S. PATENT DOCUMENTS

| | | | |
|---|---|---|---|
| 2011/0220945 A1* | 9/2011 | Kang | H01L 27/15 257/E33.068 |
| 2013/0208026 A1* | 8/2013 | Suzuki | H01L 25/0753 257/99 |
| 2014/0367715 A1* | 12/2014 | Hong | H01L 33/025 257/94 |
| 2021/0057498 A1* | 2/2021 | Pahk | H10K 59/8731 |
| 2021/0175278 A1* | 6/2021 | Lo | H01L 33/60 |
| 2022/0149128 A1* | 5/2022 | Shim | H10K 59/124 |
| 2022/0336523 A1* | 10/2022 | Hsieh | H01L 27/153 |
| 2023/0128274 A1* | 4/2023 | Lo | H01L 33/62 257/89 |

* cited by examiner

*Primary Examiner* — David Tung
(74) *Attorney, Agent, or Firm* — KILE PARK REED & HOUTTEMAN PLLC

(57) ABSTRACT

A display device including multiple first light emitting elements disposed between first pixel electrodes and a first common electrode overlapping the first pixel electrodes, multiple second light emitting elements disposed between second pixel electrodes spaced apart from the first pixel electrodes and a second common electrode overlapping the second pixel electrodes, a support layer disposed between the first light emitting elements and the second light emitting elements and having a predetermined height, a conductive pattern disposed on the support layer, and a contact layer having an end electrically connected to the first common electrode and the another end electrically connected to the conductive pattern.

14 Claims, 17 Drawing Sheets

DISPLAY DEVICE AND MANUFACTURING METHOD THEREOF

CROSS-REFERENCE TO RELATED APPLICATIONS

The application claims priority under 35 U.S.C. § 119 from Korean Patent Application No. 10-2023-0004267 filed Jan. 11, 2023 in the Korean Intellectual Property Office, the entire contents of which are incorporated herein by reference.

BACKGROUND

1. Technical Field

The disclosure relates to a display device and a manufacturing method thereof.

2. Description of the Related Art

In recent years, as interest in information displays has increased, research and development on display devices have been continuously conducted.

SUMMARY

Embodiments provide a display device including multiple light emitting elements arranged in series and a manufacturing method thereof.

In accordance with an aspect of the disclosure, there may be provided a display device that may include a plurality of first light emitting elements disposed between a plurality of first pixel electrodes and a first common electrode overlapping at least a portion of the plurality of first pixel electrodes, a plurality of second light emitting elements disposed between the plurality of second pixel electrodes and a second common electrode overlapping the plurality of second pixel electrodes, a support layer disposed between the plurality of first light emitting elements and the plurality of second light emitting elements and having a height; a conductive pattern disposed on the support layer, and a contact layer having an end electrically connected to the first common electrode and the another end electrically connected to the conductive pattern.

The support layer may overlap at least a portion of the first common electrode.

The height may be smaller than heights of ones of the plurality of first light emitting elements and ones of the plurality of second light emitting elements.

The support layer may include an organic material.

An end of the conductive pattern may be electrically connected to the contact layer and the another end of the conductive pattern may be electrically connected to the second pixel electrode.

The conductive pattern may include a metal.

The first common electrode may be electrically connected to ones of the plurality of second pixel electrodes through the contact layer and the conductive pattern.

The display device may further include an organic layer surrounding the plurality of first light emitting elements, the plurality of second light emitting elements, the conductive pattern, and the support layer and having a hole corresponding to the contact layer.

The display device may further include an inorganic layer disposed on the conductive pattern and having a hole corresponding to the contact layer.

The display device may further include an organic layer surrounding the plurality of first light emitting elements, the plurality of second light emitting elements, the inorganic layer, the conductive pattern, and the support layer.

Each of the plurality of first light emitting elements and each of the plurality of second light emitting elements may include a first semiconductor layer including a semiconductor of a first type, a second semiconductor layer including a semiconductor of a second type different from the first type, a third semiconductor layer disposed on the second semiconductor layer and including an undoped semiconductor of the second type, an active layer disposed between the first semiconductor layer and the second semiconductor layer; an electrode layer disposed on the first semiconductor layer; a reflective layer disposed on the electrode layer; and a connection electrode layer disposed on the reflective layer.

In accordance with an aspect of the disclosure, there may be provided a manufacturing method of a display device, the method including transferring a plurality of first light emitting elements onto a plurality of first pixel electrodes and transferring a plurality of second light emitting elements onto a plurality of second pixel electrodes spaced apart from the plurality of first pixel electrodes, forming a support layer having a height between the plurality of first light emitting elements and the plurality of second light emitting elements, forming a conductive pattern having an end electrically connected to one of the plurality of second pixel electrodes on the support layer, forming a contact layer having an end electrically connected to the another end of the conductive pattern, and forming a first common electrode overlapping at least a portion of the first pixel electrode on the plurality of first light emitting elements and forming a second common electrode overlapping at least a portion of one of the plurality of second pixel electrodes on the second light emitting elements.

The support layer may overlap at least a portion of the first common electrode.

The height may be smaller than heights of ones of the plurality of first light emitting elements and ones of the plurality of second light emitting elements.

The support layer may include an organic material.

The conductive pattern may include a metal.

Another end of the contact layer may be electrically connected to the first common electrode.

The first common electrode may be electrically connected to one of the plurality of second pixel electrodes through the contact layer and the conductive pattern.

The forming the contact layer may include forming an organic layer surrounding the plurality of first light emitting elements, the plurality of second light emitting elements, the conductive pattern, and the support layer, etching the organic layer to form a hole corresponding to the contact layer, and depositing a conductive material in the hole.

The forming the contact layer may include forming an inorganic layer on the conductive pattern; forming an organic layer surrounding the plurality of first light emitting elements, the plurality of second light emitting elements, the inorganic layer, the conductive pattern, and the support layer, etching the inorganic layer to form a hole corresponding to the contact layer, and depositing a conductive material in the hole.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
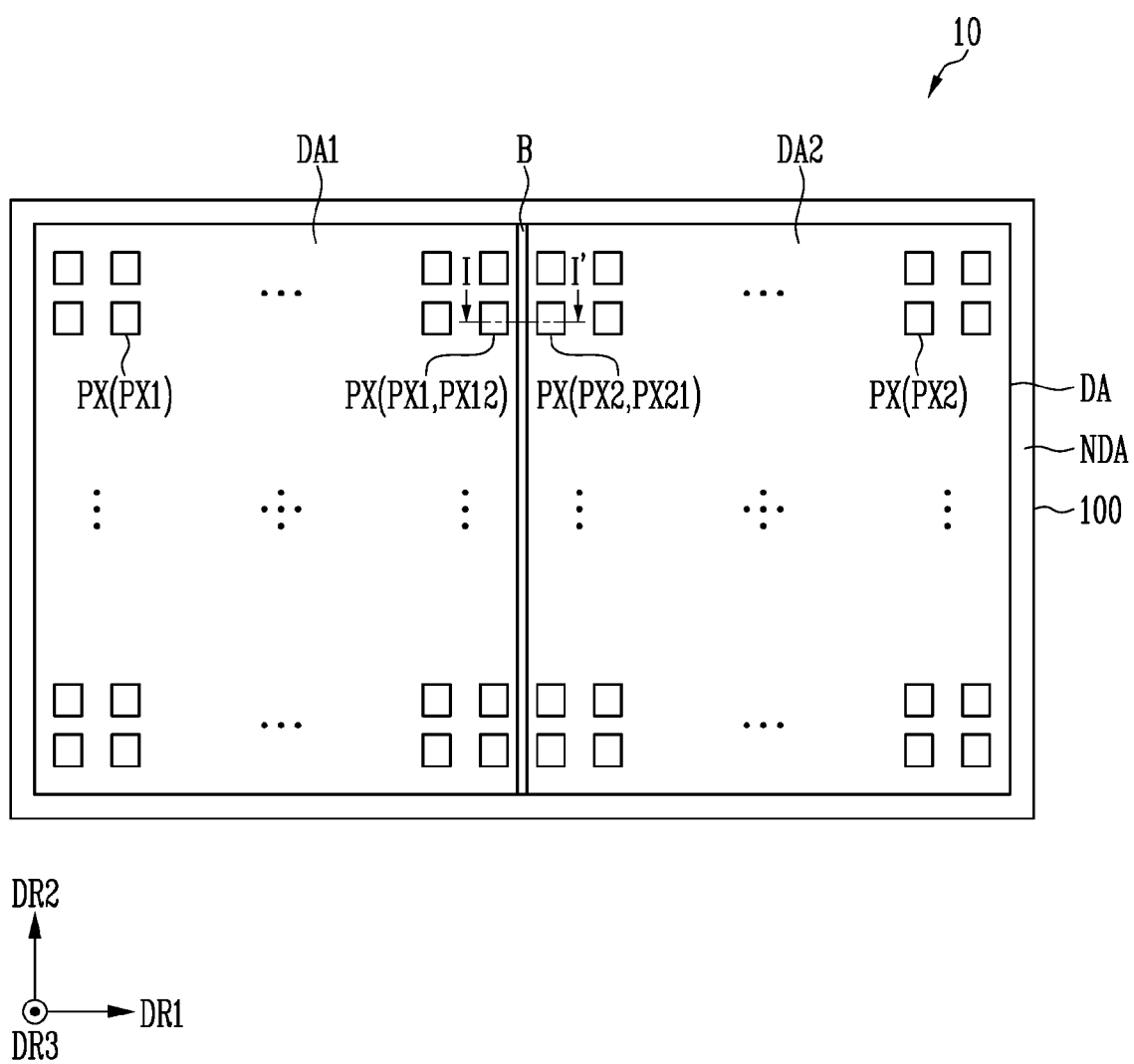
FIG. 1 is a plan view illustrating a display device in accordance with an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in an embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be predisposed differently from the described order. For example, two consecutively described processes may be predisposed substantially at the same time or predisposed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the X-axis, the Y-axis, and the Z-axis may not be limited to three axes of a rectangular coordinate system, such as the x, y, and z axes, and may be interpreted in a broader sense. For example, the X-axis, the Y-axis, and the Z-axis may be perpendicular to one another, or may be different directions that may not be perpendicular to one another.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items. A description that a component is "configured to" perform a specified operation may be defined as a case where the component is constructed and arranged with structural features that can cause the component to perform the specified operation.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, may not be necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be disposed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, portion, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein. Hereinafter, embodiments of the disclosure will be described in detail with reference to the accompanying drawings.

Figure 2:
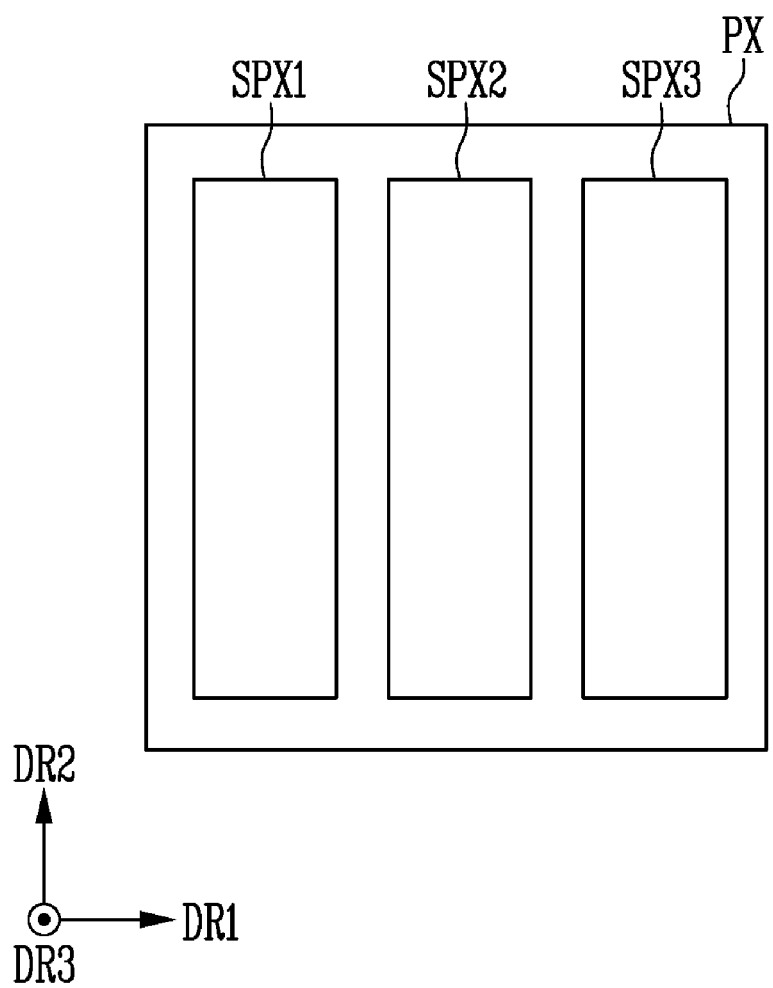
FIG. 2 is a schematic diagram illustrating a pixel in accordance with an embodiment.

FIG. 1 is a plan view illustrating a display device according to an embodiment, and FIG. 2 is a schematic diagram illustrating a pixel according to an embodiment. Referring to FIG. 1, a display device 10 may be a device that displays a moving image or a still image. The display device 10 may be used as a display screen for various products such as a television, a laptop, a monitor, a billboard, and an IOT (internet of things) as well as portable electronic devices such as a mobile phone, a smart phone, a tablet PC (personal computer), a smart watch, a watch phone, a mobile communication terminal, an electronic notebook, an electronic book, a PMP (portable multimedia player), a navigation, and a UMPC (Ultra Mobile PC).

A display panel 100 may be formed in a rectangular flat plate shape having a long side in a first direction DR1 and a short side in a second direction DR2 crossing the first direction DR1. A corner portion where the long side of the first direction DR1 and the short side of the second direction DR2 meet may be rounded to have a curvature (e.g., a predetermined or selectable curvature) or may be formed at a right angle. The planar shape of the display panel 100 may not be limited to a quadrangle and may instead be formed in a polygonal shape, a circular shape, or an elliptical shape. The display panel 100 may be formed flat, but the disclosure may not be limited thereto. For example, the display panel 100 may include curved portions formed at left and right ends and having a constant curvature or a changing curvature. The display panel 100 may be formed to be flexible so as to be bent, folded, or rolled.

The display panel 100 may include a display area DA in which an image may be displayed and a non-display area NDA in which an image may not be displayed. The display area DA may be disposed at a central area of the display panel 100 and the non-display area NDA may be disposed at an edge area of the display panel 100 to surround the display area DA. The display area DA may include pixels PX for displaying an image, scan lines extending in the first direction DR1, and data lines extending in the second direction DR2. The pixels PX may be selected by a scan signal of a turn-on level supplied from the scan lines, may receive a data signal from the data lines, and may emit light with a luminance corresponding to the data signal. The pixels PX may be arranged in a matrix form in the first direction DR1 and the second direction DR2. The structure and driving method of each of the pixels PX may be implemented in various ways and may not be particularly limited.

The display area DA may be divided into display areas spaced apart from each other. For example, the display area DA may be divided into a first display area DA1 and a second display area DA2 spaced apart from the first display area DA1 by boundary B. The display area DA may be divided into three or more display areas spaced apart from each other, and the number of display areas may not be particularly limited.

The number of pixels PX included in each display area may be the same or different. For example, the number of first pixels PX1 included in the first display area DA1 and the number of second pixels PX2 included in the second display area DA2 may be the same as or different from each other. For example, the number of pixels PX included in each display area may not be particularly limited.

From an electrical standpoint, each pixel includes a pixel circuit and a light emitting element. The pixels PX included in each display area may be electrically connected in parallel between two voltage sources. For example, the first pixels PX1 included in the first display area DA1 may be electrically connected in parallel and the second pixels PX2 included in the second display area DA2 may be electrically connected in parallel between the two voltage sources. For example, the pixels PX included in the same display area may be electrically connected in parallel between two voltage sources.

The pixels PX adjacent to the boundary between the display areas and physically spaced apart from each other may be electrically connected in series between two voltage sources. For example, first pixels PX12 and second pixels PX21 adjacent to the boundary B between the first display area DA1 and the second display area DA2 may be electrically connected in series between the two voltage sources.

As described above, in case that the pixels PX are electrically connected in series/parallel, high luminance can be expressed with the same current or the same luminance can be expressed with a low current, compared to the case where the pixels PX are only electrically connected in parallel. Therefore, power efficiency can be improved. Even if a short circuit defect occurs in some of the pixels PX, the luminance can be expressed through the remaining pixels PX. Therefore, the possibility of dark spot defects in the pixels PX can be reduced.

In the non-display area NDA, various wirings and/or built-in circuits electrically connected to the pixels PX of the display area DA may be disposed. For example, multiple wirings may be disposed in the non-display area NDA to supply various power and voltage sources and control signals to the display area DA. A scan driver, a data driver, and the like may be further disposed in the non-display area NDA.

Each of the pixels PX may include multiple sub-pixels SPX1, SPX2, and SPX3. FIG. 2 shows an embodiment in which each of the pixels PX includes three sub-pixels SPX1, SPX2, and SPX3, for example, a first sub-pixel SPX1, a second sub-pixel SPX2, and a third sub-pixel SPX3, as an example, but the disclosure may not be limited thereto.

The first sub-pixel SPX1, the second sub-pixel SPX2, and the third sub-pixel SPX3 may be electrically connected to one of the data lines and at least one of the scan lines. Each of the first sub-pixel SPX1, the second sub-pixel SPX2, and the third sub-pixel SPX3 may have a rectangular, square, or rhombus planar shape. For example, each of the first sub-pixel SPX1, the second sub-pixel SPX2, and the third sub-pixel SPX3 may have a rectangle planar shape having a short side in the first direction DR1 and a long side in the second direction DR2 (refer to FIG. 2). Each of the first sub-pixel SPX1, the second sub-pixel SPX2, and the third sub-pixel SPX3 may have a square or rhombus planar shape including sides having equal lengths in the first direction DR1 and the second direction DR2.

The first sub-pixel SPX1, the second sub-pixel SPX2, and the third sub-pixel SPX3 may be arranged in the first direction DR1 (refer to FIG. 2). Any one of the second sub-pixel SPX2 and the third sub-pixel SPX3 and the first sub-pixel SPX1 may instead be arranged in the first direction DR1, and the other one and the first sub-pixel SPX1 may be arranged in the second direction DR2. Any one of the first sub-pixel SPX1 and the third sub-pixel SPX3 and the second sub-pixel SPX2 may instead be arranged in the first direction DR1, and the other one and the second sub-pixel SPX2 may instead be arranged in the second direction DR2. Any one of the first sub-pixel SPX1 and the second sub-pixel SPX2 and the third sub-pixel SPX3 may instead be arranged in the first direction DR1, and the other one and the third sub-pixel SPX3 may instead be arranged in the second direction DR2.

The first sub-pixel SPX1 may emit first light, the second sub-pixel SPX2 may emit second light, and the third sub-pixel SPX3 may emit third light. Here, the first light may be light of a red wavelength band, the second light may be light of a green wavelength band, and the third light may be light of a blue wavelength band. The red wavelength band may be a wavelength band of about 600 nm to about 750 nm, the green wavelength band may be a wavelength band of about 480 nm to about 560 nm, and the blue wavelength band may be a wavelength band of about 370 nm to about 460 nm, but the disclosure may not be limited thereto. Each of the first sub-pixel SPX1, the second sub-pixel SPX2, and the third sub-pixel SPX3 may include an inorganic light emitting element having an inorganic semiconductor as a light emitting element that emits light.

An area of the first sub-pixel SPX1, an area of the second sub-pixel SPX2, and an area of the third sub-pixel SPX3 may be substantially the same (refer to FIG. 2), but the disclosure may not be limited thereto. For example, at least one of the area of the first sub-pixel SPX1, the area of the second sub-pixel SPX2, and the area of the third sub-pixel SPX3 may be different from the other one. Two of the area of the first sub-pixel SPX1, the area of the second sub-pixel SPX2, and the area of the third sub-pixel SPX3 may instead be substantially the same, and the other one may be different from the two. The area of the first sub-pixel SPX1, the area of the second sub-pixel SPX2, and the area of the third sub-pixel SPX3 may instead be different from each other.

Figure 3:
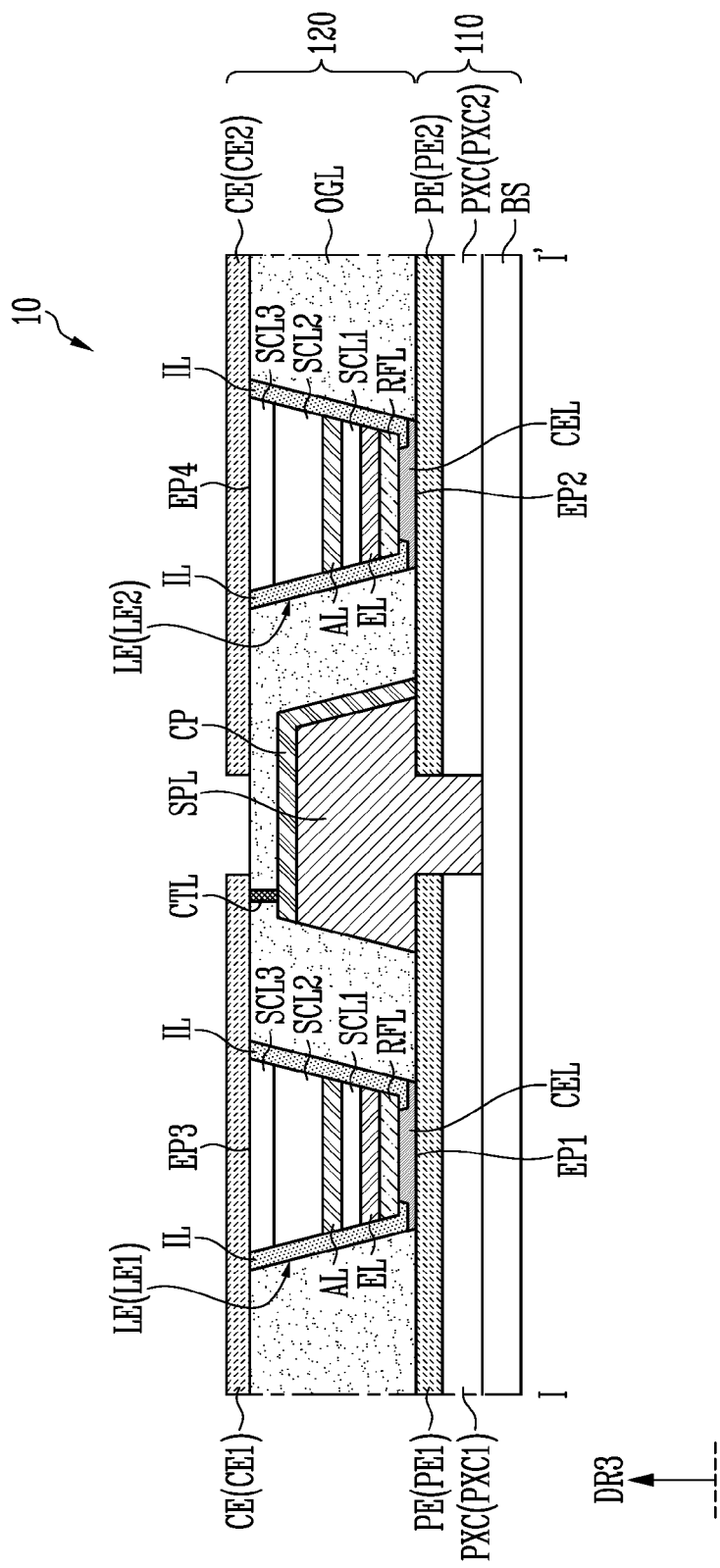
FIG. 3 is a schematic cross-sectional view taken along line I-I' of FIG. 1.
Figure 4:
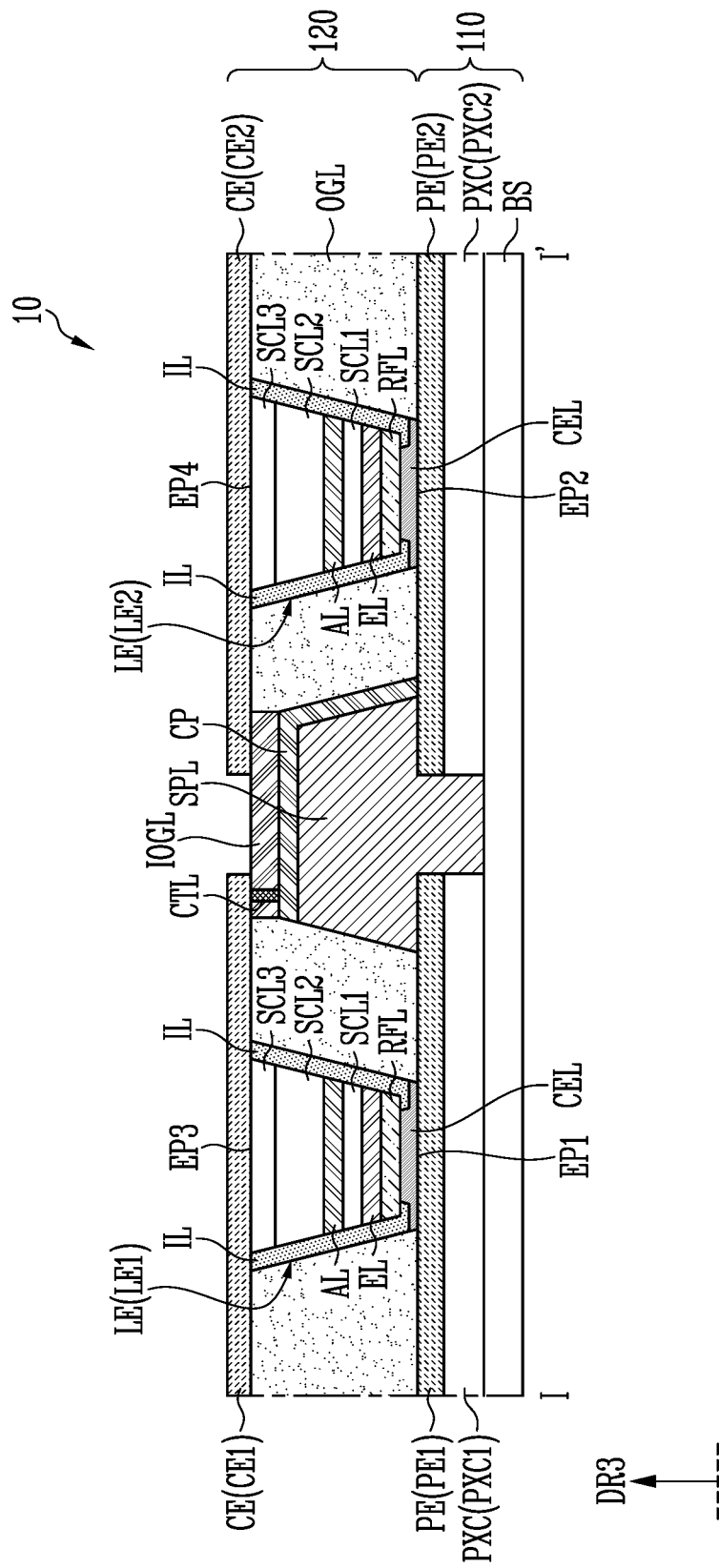
FIG. 4 is another schematic cross-sectional view taken along line I-I' of FIG. 1.

FIG. 3 is a schematic cross-sectional view taken along line I-I' of FIG. 1, and FIG. 4 is another schematic cross-sectional view taken along line I-I' of FIG. 1. In FIGS. 3 and 4, an embodiment in which the display device is a Light Emitting Diode on Silicon (LEDoS) in which light emitting diodes may be disposed as light emitting elements on a semiconductor circuit board 110 formed by a semiconductor process using a silicon wafer will be described, but the disclosure may not be limited thereto.

Referring to FIGS. 1, 3, and 4, the display panel 100 may include a semiconductor circuit board 110 and a light emitting element layer 120. The semiconductor circuit board 110 may include a base substrate BS, a pixel circuit portion (or pixel circuits) PXC, and a pixel electrode PE. According to an embodiment, the semiconductor circuit board 110 may further include an insulating layer disposed between pixel electrodes PE.

The base substrate BS may be a silicon wafer substrate. However, the disclosure may not be limited thereto. For example, the base substrate BS may instead be made of single crystal silicon. The pixel circuit portion PXC may include a complementary metal-oxide semiconductor (CMOS) circuit formed through a semiconductor process. The pixel circuit portion PXC may include pixel circuits for each of the pixels PX, each pixel circuit may in turn include at least one transistor formed through a semiconductor process. Also, each pixel circuit of the pixel circuit portion PXC may further include at least one capacitor formed through a semiconductor process. Each pixel circuit of the pixel circuit portion PXC may be electrically connected to a corresponding one of the light emitting elements LE to provide an electrical signal so that the light emitting elements LE emit light.

The pixel circuit portion PXC may be disposed on the base substrate BS and be divided into multiple pixel circuit parts spaced apart from each other. For example, the pixel circuit portion PXC may be divided into a first pixel circuit part PXC1 disposed on the base substrate BS and a second pixel circuit part PXC2 spaced apart from the first pixel circuit part PXC1. The first pixel circuit part PXC1 may be disposed to overlap first light emitting elements LE1, and the second pixel circuit part PXC2 may be disposed to overlap second light emitting elements LE2.

The pixel electrode portion PE may be electrically connected to the pixel circuit portion PXC. The pixel electrode portion PE may provide a pixel voltage or an anode voltage transmitted from the pixel circuit portion PXC to the light emitting elements LE. The pixel electrode portion PE may include a conductive material. For example, the pixel electrode portion PE may include one or more selected from the group consisting of silver (Ag), magnesium (Mg), aluminum (Al), platinum (Pt), palladium (Pd), gold (Au), nickel (Ni), neodymium (Nd), iridium (Ir), chromium (Cr), and titanium (Ti). The pixel electrode portion PE may also be referred to as an anode electrode.

The pixel electrode portion PE may be disposed on the pixel circuit portion PXC and divided into multiple pixel electrodes spaced apart from each other. For example, the pixel electrode portion PE may be divided into multiple first pixel electrodes PE1 disposed on the first pixel circuit part PXC1 and multiple second pixel electrodes PE2 disposed on the second pixel circuit part PXC2 and spaced apart from the first pixel electrodes PE1. The pixel electrode portion PE may be disposed below the light emitting elements LE and be electrically connected to the light emitting elements LE. For example, one of the first pixel electrodes PE1 may be electrically connected to one of the first light emitting elements LE1 through a first end EP1 adjacent to a connection electrode layer CEL of the one of the first light emitting elements LE1. Also, one of the second pixel electrodes PE2 may be electrically connected to one of the second light emitting elements LE2 through a second end EP2 adjacent to a connection electrode layer CEL of the one of the second light emitting elements LE2.

According to an embodiment, the display panel 100 may further include a support layer SPL disposed on the base substrate BS. The support layer SPL may be disposed between the pixel circuits spaced apart from each other and between the pixel electrodes spaced apart from each other. For example, the support layer SPL may be disposed between the first pixel circuit part PXC1 and the second pixel circuit part PXC2 and between the first pixel electrodes PE1 and the second pixel electrodes PE2.

Referring to FIG. 3, the light emitting element layer 120 may include the light emitting elements LE, a common electrode CE, the support layer SPL, a conductive pattern CP, a contact layer CTL, and an organic layer OGL. The light emitting elements LE may be disposed on the pixel electrode PE. For example, the first light emitting elements LE1 may be disposed on the first pixel electrodes PE1 and the second light emitting elements LE2 may be disposed on the second pixel electrodes PE2. In this case, one of the first light emitting elements LE1 may be provided to a first pixel PX12 and one of the second light emitting elements LE2 may be provided to a second pixel PX21 (refer to FIG. 1). Light emitting elements provided to each of the first pixels PX1 disposed in the first display area DA1 may be disposed on the first pixel electrodes PE1 and light emitting elements provided to each of the second pixels PX2 disposed in the second display area DA2 may be disposed on the second pixel electrodes PE2.

Each light emitting element LE may be a vertical light emitting diode element extending in a third direction DR3. Each light emitting element LE may be a micro light emitting diode element or a nano light emitting diode element. Each light emitting element LE may include the connection electrode layer CEL, a reflective layer RFL, an electrode layer EL, a first semiconductor layer SCL1, an active layer AL, a second semiconductor layer SCL2, a third semiconductor layer SCL3, and an insulating layer IL.

The connection electrode layer CEL may be disposed on pixel electrodes of the pixel electrode portion PE. The connection electrode layer CEL may be a bonding metal for bonding to pixel electrodes of the pixel electrode portion PE and the light emitting elements LE respectively. The connection electrode layer CEL may be electrically connected to the pixel electrodes of pixel electrode portion PE to apply an emission signal to the light emitting elements LE. The connection electrode layer CEL may include a eutectic metal. For example, the connection electrode layer CEL may include an alloy of tin (Sn), silver (Ag), and copper (Cu), but the disclosure may not be limited thereto. For example, the connection electrode layer CEL may include one or more selected from the group consisting of tin (Sn), silver (Ag), aluminum (Al), and copper (Cu).

The reflective layer RFL may be disposed on the connection electrode layer CEL. The reflective layer RFL may reflect light emitted from the light emitting elements LE so that the emitted light proceeds in a direction in which an image may be displayed. The reflective layer RFL may include a reflective material. For example, the reflective layer RFL may include one or more selected from the group consisting of silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof.

The electrode layer EL may be disposed on the reflective layer RFL. The electrode layer EL may include one or more selected from the group consisting of indium tin oxide (ITO), chromium (Cr), titanium (Ti), aluminum (Al), gold (Au), nickel (Ni), an oxide thereof, and an alloy thereof.

The first semiconductor layer SCL1 may be disposed on the electrode layer EL. The first semiconductor layer SCL1 may include a first type semiconductor. For example, the first semiconductor layer SCL1 may include a P-type semiconductor including one or more selected from the group consisting of InAlGaN, GaN, AlGaN, InGaN, AlN, and InN, and doped with a first conductivity type dopant such as Ga, B, and Mg.

The active layer AL may be disposed on the first semiconductor layer SCL1. The active layer AL may include a single-quantum well or multi-quantum well structure. The position of the active layer AL may not be limited to a specific example and may instead be variously changed according to the type of light emitting elements LE. The active layer AL may emit light by combining electron-hole pairs according to an electrical signal applied through the first semiconductor layer SCL1 and the second semiconductor layer SCL2.

The second semiconductor layer SCL2 may be disposed on the active layer AL. The second semiconductor layer SCL2 may include a second type semiconductor different from the first semiconductor layer SCL1. For example, the second semiconductor layer SCL2 may include an N-type semiconductor layer including one or more selected from the group consisting of InAlGaN, GaN, AlGaN, InGaN, AlN, and InN, and doped with a second conductive dopant such as Si, GE, and SN.

The third semiconductor layer SCL3 may be disposed on the second semiconductor layer SCL2. The third semiconductor layer SCL3 may include a third type semiconductor that includes a semiconductor of the same type as the second semiconductor layer SCL2, but may not be doped with an N-type or P-type dopant. For example, the third semiconductor layer SCL3 may include one or more selected from the group consisting of undoped InAlGaN, GaN, AlGaN, InGaN, AlN, and InN. According to an embodiment, the third semiconductor layer SCL3 may be omitted.

The insulating layer IL may be disposed on a surface of the light emitting element LE. For example, the insulating layer IL may be disposed to surround side surfaces of the connection electrode layer CEL, the reflective layer RFL, the electrode layer EL, the first semiconductor layer SCL1, the active layer AL, the second semiconductor layer SCL2, and the third semiconductor layer SCL3. The insulating layer IL may prevent an electrical short circuit that may occur in case that the active layer AL may be in contact with other conductive materials other than the first semiconductor layer SCL1 and the second semiconductor layer SCL2. The insulating layer IL may minimize defects on a surface of the light emitting element LE, thereby improving the lifetime of the light emitting element LE. According to an embodiment, the insulation layer IL may instead be omitted.

The common electrode CE may be electrically connected to a power (or voltage) source line that corresponds to one of the two voltage sources that the pixels are connected between. The common electrode CE may provide a common voltage or a cathode voltage transmitted from the power source line to the light emitting elements. The common electrodes CE may include a conductive material. For example, the common electrode CE may include one or more selected from the group consisting of a conductive oxide such as indium tin oxide (ITO), indium zinc oxide (IZO), zinc oxide (ZnO), indium gallium zinc oxide (IGZO), and indium tin zinc oxide (ITZO), and a conductive polymer such as PEDOT (poly (3,4-ethylenedioxythiophene)). The common electrode CE may also be referred to as a cathode electrode.

The common electrode CE may be disposed on the light emitting element LE and may be divided into multiple common electrodes spaced apart from each other. For example, the common electrode CE may be divided into a first common electrode CE1 disposed on the first light emitting element LE1 and a second common electrode CE2 disposed on the second light emitting element LE2 and spaced apart from the first common electrode CE1.

The common electrode CE may be disposed on the light emitting elements LE and be electrically connected to the light emitting elements LE. For example, the first common electrode CE1 may be electrically connected to the first light emitting element LE1 through a third end EP3 adjacent to the third semiconductor layer SCL3 of the first light emitting element LE1. Also, the second common electrode CE2 may be electrically connected to the second light emitting element LE2 through a fourth end EP4 adjacent to the third semiconductor layer SCL3 of the second light emitting element LE2. The first common electrode CE1 may be electrically connected to light emitting elements provided to each of the first pixels PX1 disposed in the first display area DA1, and the second common electrode CE2 may be electrically connected to light emitting elements provided to each of the second pixels PX2 disposed in the second display area DA2.

The common electrode CE may be disposed to overlap the pixel electrode PE. For example, the first common electrode CE1 may be disposed to overlap the first pixel electrode PE1. Also, the second common electrode CE2 may be disposed to overlap the second pixel electrode PE2.

The length of the common electrode CE overlapping the pixel electrode portion PE may be the same as or different from that of the pixel electrode portion PE. For example, the length of the first common electrode CE1 overlapping the first pixel electrodes PE1 may be the same as that of the first pixel electrodes PE1, and the length of the second common electrode CE2 overlapping the second pixel electrodes PE2 may be the same as that of the second pixel electrodes PE2. The length of the first common electrode CE1 overlapping the first pixel electrodes PE1 may instead be longer than that of the first pixel electrodes PE1, and the length of the second common electrode CE2 overlapping the second pixel electrodes PE2 may instead be longer than that of the second pixel electrodes PE2. The length of the first common electrode CE1 overlapping the first pixel electrodes PE1 may instead be shorter than that of the first pixel electrodes PE1, and the length of the second common electrode CE2 overlapping the second pixel electrodes PE2 may instead be shorter than that of the second pixel electrodes PE2.

The support layer SPL may extend in the third direction DR3 and have a height (or thickness) to function as a structure supporting the conductive pattern CP and the contact layer CTL. According to an embodiment, the height (or thickness) of the support layer SPL may be smaller than the height (or thickness) of the light emitting elements LE extending in the third direction DR3. For example, the height (or thickness) of ones of the light emitting elements LE extending in the third direction DR3 may be about 5 μm to about 7 μm, and the height (or thickness) of the support layer SPL may be smaller than the height (or thickness) of ones of the light emitting elements LE described above. Accordingly, the support layer SPL may function as a structure that readily connects the first pixels PX12 and the second pixels PX21 in series.

FIGS. 3 and 4 show the support layer SPL having a trapezoidal cross-sectional shape, but the shape of the support layer SPL may not be limited thereto. As long as the support layer SPL functions as a structure supporting the conductive pattern CP and the contact layer CTL, the shape of the support layer SPL may be implemented in various ways. The support layer SPL may include an organic material stably supporting the conductive pattern CP and the contact layer CTL. For example, the support layer SPL may include one or more selected from the group consisting of a polyacrylates resin, an epoxy resin, a phenolic resin, a polyamides resin, and a polyimide resin. However, the disclosure may not be limited thereto. For example, the support layer SPL may instead include an inorganic material.

The conductive pattern CP may be disposed on the support layer SPL. An end of the conductive pattern CP may be electrically connected to one of the second pixel electrodes PE2. Another end of the conductive pattern CP may be electrically connected to the contact layer CTL. For example, the conductive pattern CP may function as an electrical passage electrically connecting the contact layer CTL and one of the second pixel electrodes PE2. The conductive pattern CP may include a conductive material. According to an embodiment, the conductive pattern CP may be made of a metal material. For example, the conductive pattern CP may include one or more selected from the group consisting of silver (Ag), magnesium (Mg), aluminum (Al), platinum (Pt), palladium (Pd), gold (Au), nickel (Ni), neodymium (Nd), iridium (Ir), chromium (Cr), and titanium (Ti). The contact layer CTL may be disposed on the conductive pattern CP in a form penetrating the organic layer OGL (refer to FIG. 3). An end of the contact layer CTL may be physically and electrically connected to the conductive pattern CP. Another end of the contact layer CTL may be physically and electrically connected to the first common electrode CE1. For example, the contact layer CTL may function as an electrical passage electrically connecting the first common electrode CE1 and the conductive pattern CP. The contact layer CTL may include a conductive material. For example, the contact layer CTL may include one or more selected from the group consisting of a conductive oxide such as indium tin oxide (ITO), indium zinc oxide (IZO), zinc oxide (ZnO), indium gallium zinc oxide (IGZO), and indium tin zinc oxide (ITZO), and a conductive polymer such as PEDOT (poly(3,4-ethylenedioxythiophene).

According to an embodiment, the contact layer CTL may include a conductive material such as the material of the common electrode CE.

The organic layer OGL may be disposed to surround the light emitting elements LE, the support layer SPL, the conductive pattern CP, and the contact layer CTL. The organic layer OGL may include an organic material stably fixing the light emitting elements LE, the support layer SPL, the conductive pattern CP, and the contact layer CTL. For example, the organic layer OGL may include one or more selected from the group consisting of a polyacrylate resin, an epoxy resin, a phenolic resin, a polyamide resin, and a polyimide rein. However, the disclosure may not be limited thereto. As another example, the organic layer OGL may instead include an inorganic material.

Referring to FIG. 4, the light emitting element layer 120 may further include an inorganic layer IOGL. In relation to FIG. 4, subject matter overlapping that of FIG. 3 will be briefly described or omitted. The inorganic layer IOGL of FIG. 4 may be disposed on the conductive pattern CP. The inorganic layer IOGL may contact the common electrode CE. For example, the inorganic layer IOGL may contact the first common electrode CE1 and the second common electrode CE2. The inorganic layer IOGL may include an inorganic material that facilitates the formation of the contact layer CTL. For example, the inorganic layer IOGL may include one or more of aluminum oxide, titanium oxide, silicon oxide, silicon oxynitride, zirconium oxide, and hafnium oxide. The contact layer CTL may be disposed on the conductive pattern CP in a form penetrating the inorganic layer IOGL (refer to FIG. 4). In FIG. 4, only the material layer for forming the contact layer CTL may be different from that of FIG. 3, and the function of the contact layer CTL as an electrical passage electrically connecting the first common electrode CE1 and the conductive pattern CP may be the same.

Figure 5:
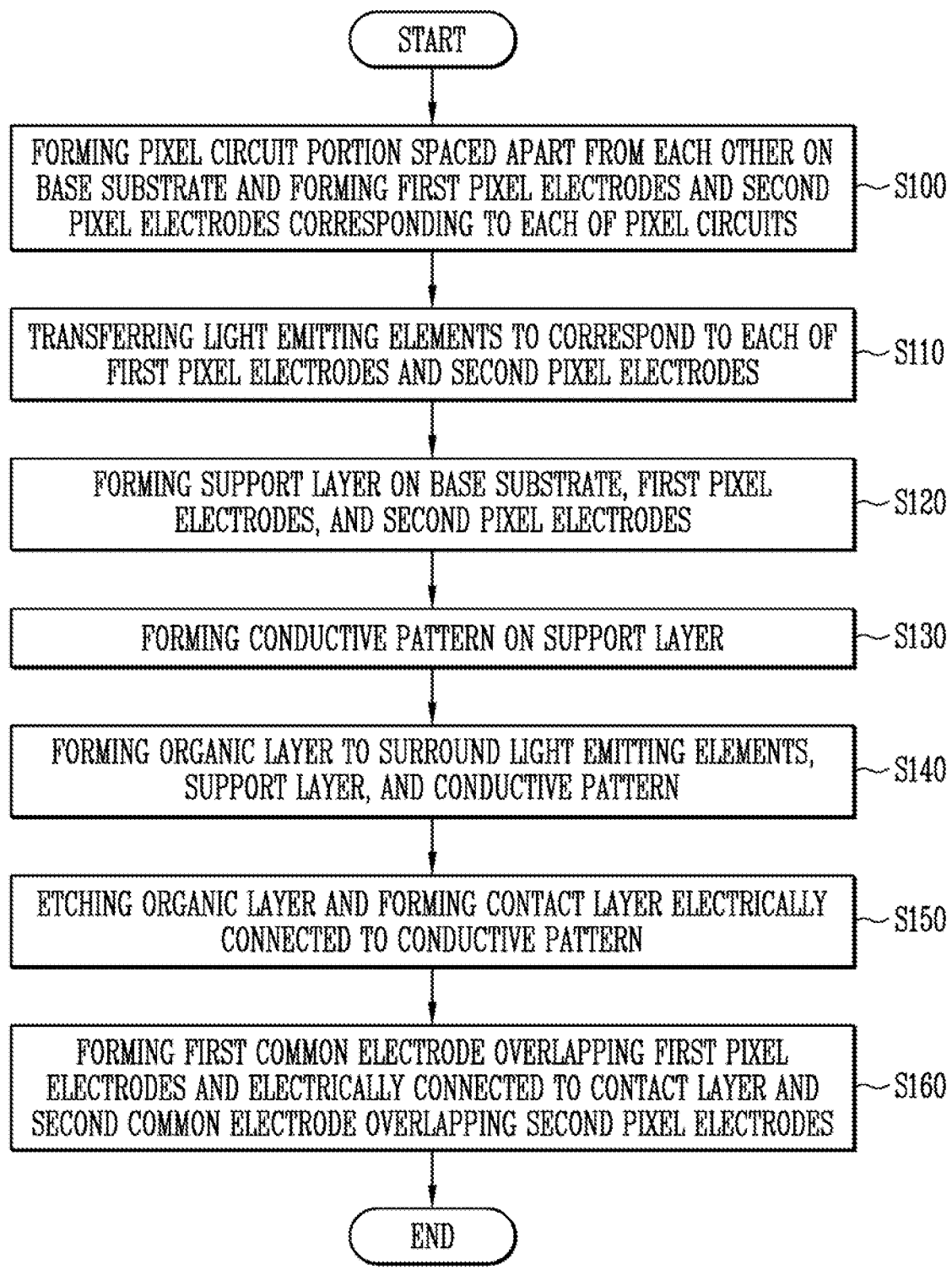
FIG. 5 is a flow chart for explaining a manufacturing method of a display device in accordance with an embodiment of FIG. 3.

FIG. 5 is a flow chart for explaining a manufacturing method of a display device according to an embodiment of FIG. 3, and FIGS. 6 to 12 are schematic diagrams for explaining the manufacturing method of the display device according to the embodiment of FIG. 3. Referring to FIG. 5, a manufacturing method of a display device according to an embodiment may include forming pixel circuits spaced apart from each other on a base substrate and forming first pixel electrodes and a second pixel electrodes corresponding to each of the pixel circuits (S100), transferring light emitting elements to correspond to each of the first pixel electrodes and the second pixel electrodes (S110), forming a support layer on the base substrate, the first pixel electrodes, and the second pixel electrodes (S120), forming a conductive pattern on the support layer (S130), forming an organic layer to surround the light emitting elements, the support layer, and the conductive pattern (S140), etching the organic layer and forming a contact layer electrically connected to the conductive pattern (S150), and forming a first common electrode overlapping the first pixel electrodes and electrically connected to the contact layer and a second common electrode overlapping the second pixel electrodes (S160).

Figure 6:
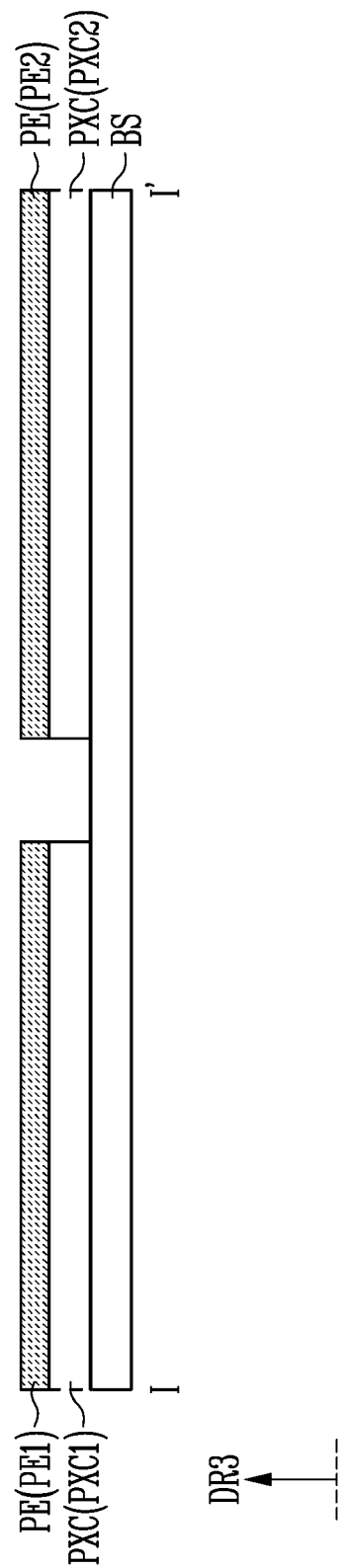
FIGS. 6, 7, 8, 9, 10, 11 and 12 are schematic diagrams for explaining the manufacturing method of the display device in accordance with an embodiment of FIG. 3.

Referring to FIGS. 5 and 6, pixel circuit parts of pixel circuit portion PXC spaced apart from each other may be formed on a base substrate BS (S100). For example, a first pixel circuit part PXC1 and a second pixel circuit part PXC2 spaced apart from the first pixel circuit part PXC1 may be formed on the base substrate BS. The first pixel circuit part PXC1 and the second pixel circuit part PXC2 may be formed through a semiconductor process.

Multiple first pixel electrodes PE1 and multiple second pixel electrodes PE2 corresponding to each of the pixel circuits of pixel circuit portion PXC may be formed (S100). For example, the first pixel electrodes PE1 may be formed on the first pixel circuit part PXC1 and the second pixel electrodes PE2 may be formed on the second pixel circuit part PXC2. The first pixel electrodes PE1 and the second pixel electrodes PE2 may be formed through a deposition process.

Figure 7:
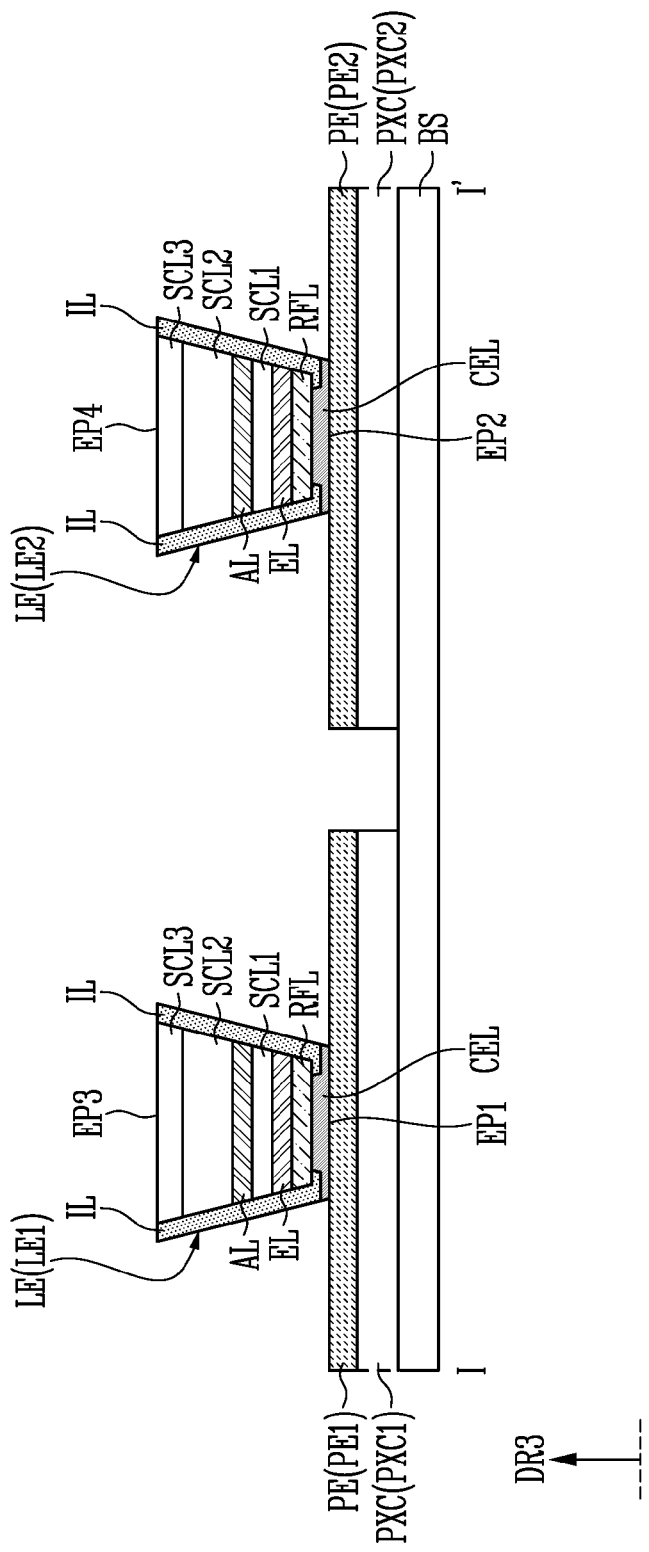

Referring to FIGS. 5 and 7, light emitting elements LE may be transferred to correspond to each of the first pixel electrodes PE1 and the second pixel electrodes PE2 (S110). For example, first light emitting elements LE1 may be transferred onto the first pixel electrodes PE1 and second light emitting elements LE2 may be transferred onto the second pixel electrodes PE2.

For convenience of description, in FIG. 7, among the first light emitting elements LE1 transferred onto the first pixel electrodes PE1, first light emitting elements LE1 adjacent to second light emitting elements LE2 transferred onto the second pixel electrodes PE2 may be shown. Similarly, in FIG. 7, among the second light emitting elements LE2 transferred onto the second pixel electrodes PE2, second light emitting elements LE2 adjacent to first light emitting elements LE1 transferred onto one of the first pixel electrodes PE1 may be shown.

The light emitting elements LE may be transferred onto the pixel electrodes PE through a bonding method. For example, the light emitting elements LE may be transferred onto the pixel electrodes PE through an anisotropic conductive film (AFC) bonding method, a laser assist bonding (LAB) method using a laser, an ultrasonic bonding method, a bump-ball surface mounting method (Ball Grid Array, BGA), a pressure and heat bonding (Thermo Compression, TC) method, or the like. However, the disclosure may not be limited thereto, and various transfer methods other than the above bonding methods may instead be employed.

Figure 8:
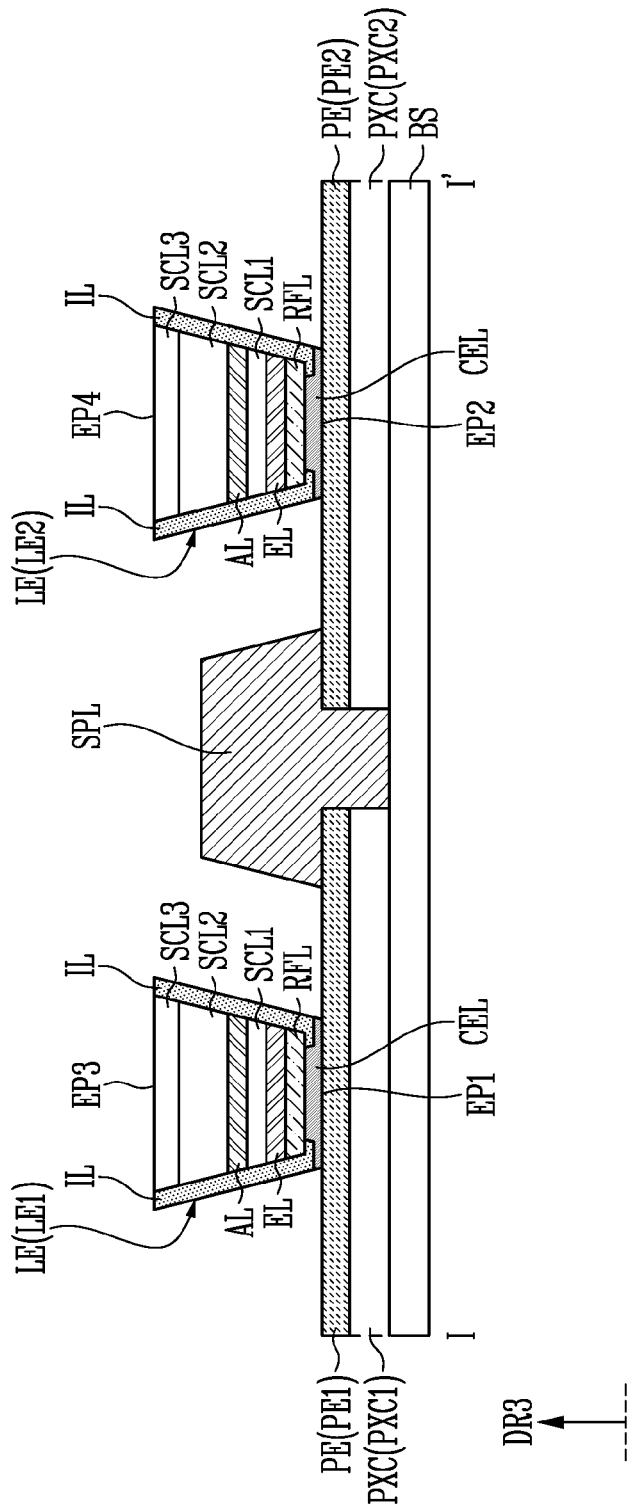

Referring to FIGS. 5 and 8, a support layer SPL may be formed on the base substrate BS, the first pixel electrodes PE1, and the second pixel electrodes PE2 (S120). For example, the support layer SPL may be formed between the first pixel circuit part PXC1 and the second pixel circuit part PXC2 and between the first pixel electrodes PE1 and the second pixel electrodes PE2. Also, the support layer SPL may be formed to extend in a third direction DR3 on the first pixel electrodes PE1 and the second pixel electrodes PE2. As described above, the height (or thickness) of the support layer SPL may be smaller than the height (or thickness) of the light emitting element LE.

According to an embodiment, the order of steps S110 and S120 may be reversed. For example, step S120 may be performed after step S100 and step S110 may be performed after step S120. For example, after the support layer SPL may be formed, the light emitting elements LE may be transferred.

Figure 9:
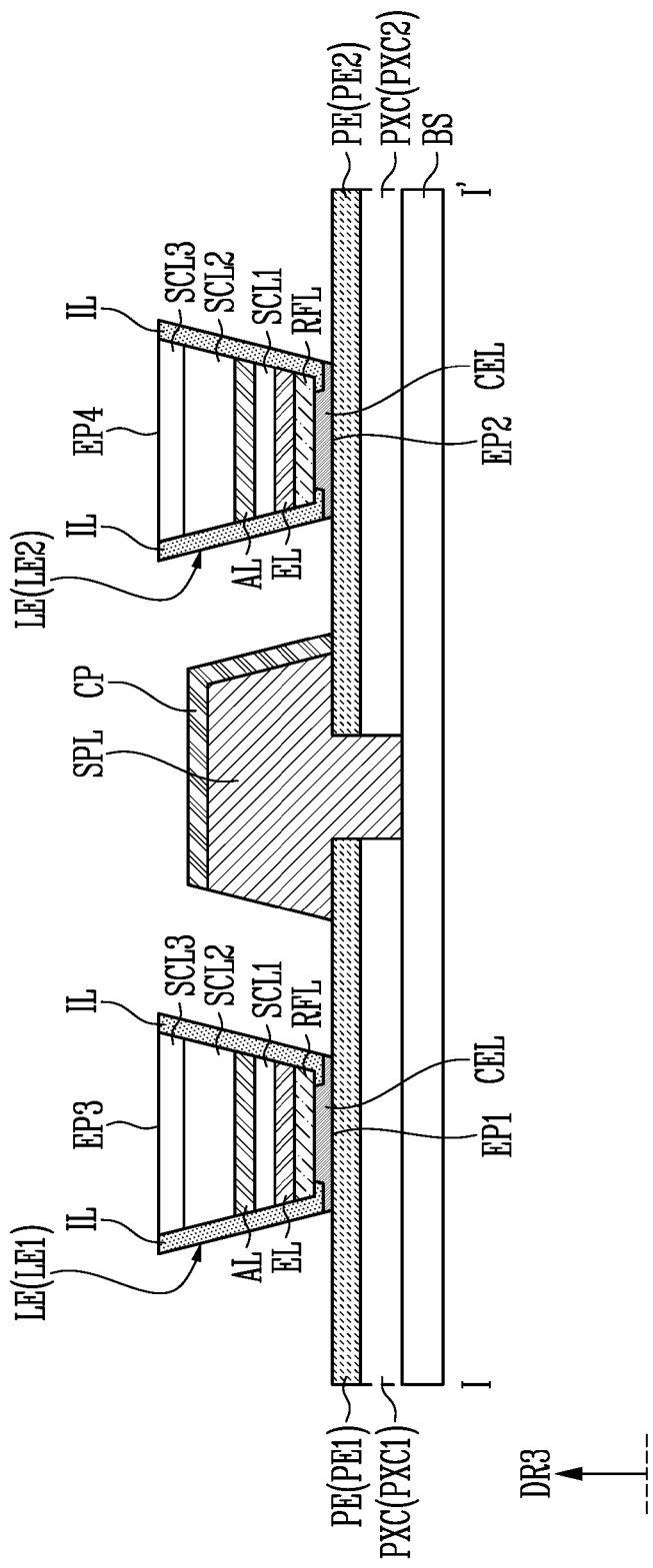

Referring to FIGS. 5 and 9, a conductive pattern CP may be formed on the support layer SPL (S130). According to an embodiment, an end of the conductive pattern CP may be formed to contact the second pixel electrodes PE2.

Figure 10:
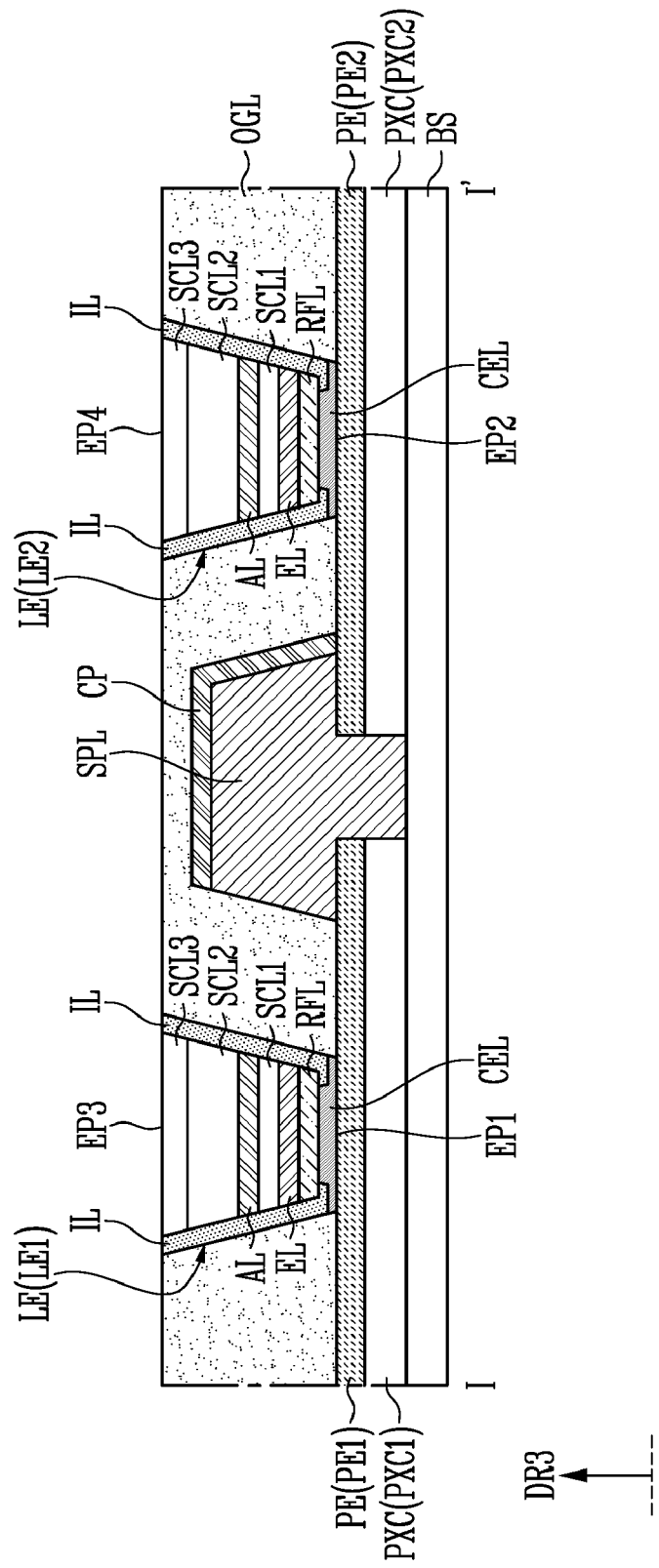

Referring to FIGS. 5 and 10, an organic layer OGL may be formed to surround the light emitting elements LE, the support layer SPL, and the conductive pattern CP (S140). The organic layer OGL may be formed up to the height of the light emitting elements LE. The organic layer OGL may provide a flat upper surface.

Figure 11:
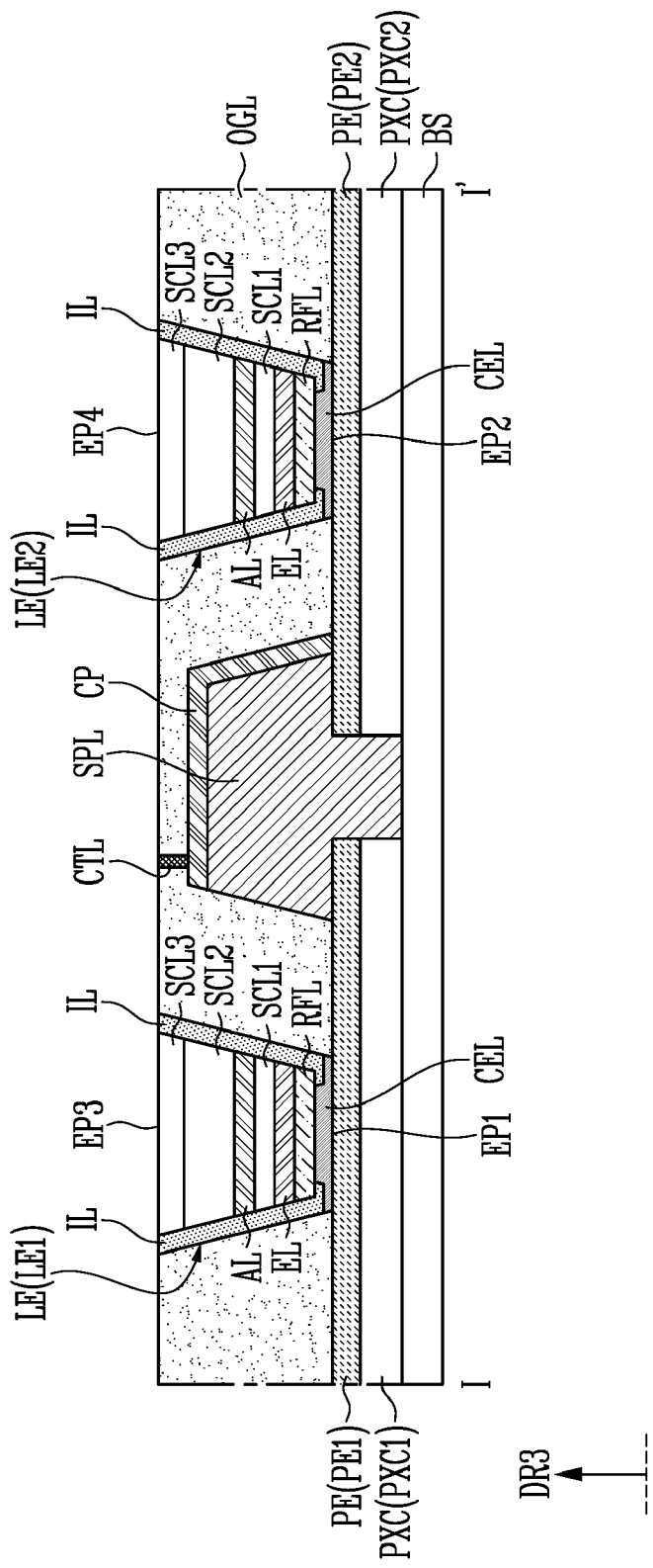

Referring to FIGS. 5 and 11, a contact layer CTL electrically connected to the conductive pattern CP may be formed by etching the organic layer OGL (S150). According to an embodiment, a hole may be formed by etching a portion of the organic layer OGL, and the contact layer CTL may be formed by depositing a conductive material in the hole. The organic layer OGL may be etched using a dry etching method, but the disclosure may not be limited thereto. For example, the organic layer OGL may instead be etched using a wet etching method.

The contact layer CTL may be formed through an etching process and a deposition process. In case that the support layer SPL and the conductive pattern CP may not be formed, since the required etching depth increases as the organic layer OGL becomes thicker (about 5 µm to about 7 µm), the etching process may not be straightforward and simple and the process time may increase. As the process time increases, the light emitting elements LE may be exposed to plasma and damaged. Also, during the etching process, the etching depth for each position of the display panel 100 may be non-uniform, which may increase etching distribution. Since the etching depth may be deep and non-uniform, dispersion (or variation) of the deposition process may also be increased.

In the disclosure, as the support layer SPL and the conductive pattern CP may be formed, the amount of the organic layer OGL to be etched decreases in case that the contact layer CTL may be formed, and thus the etching depth may be reduced. Accordingly, the etching process and the deposition process may be facilitated, process time may be shortened, and process dispersion may be reduced.

Figure 12:
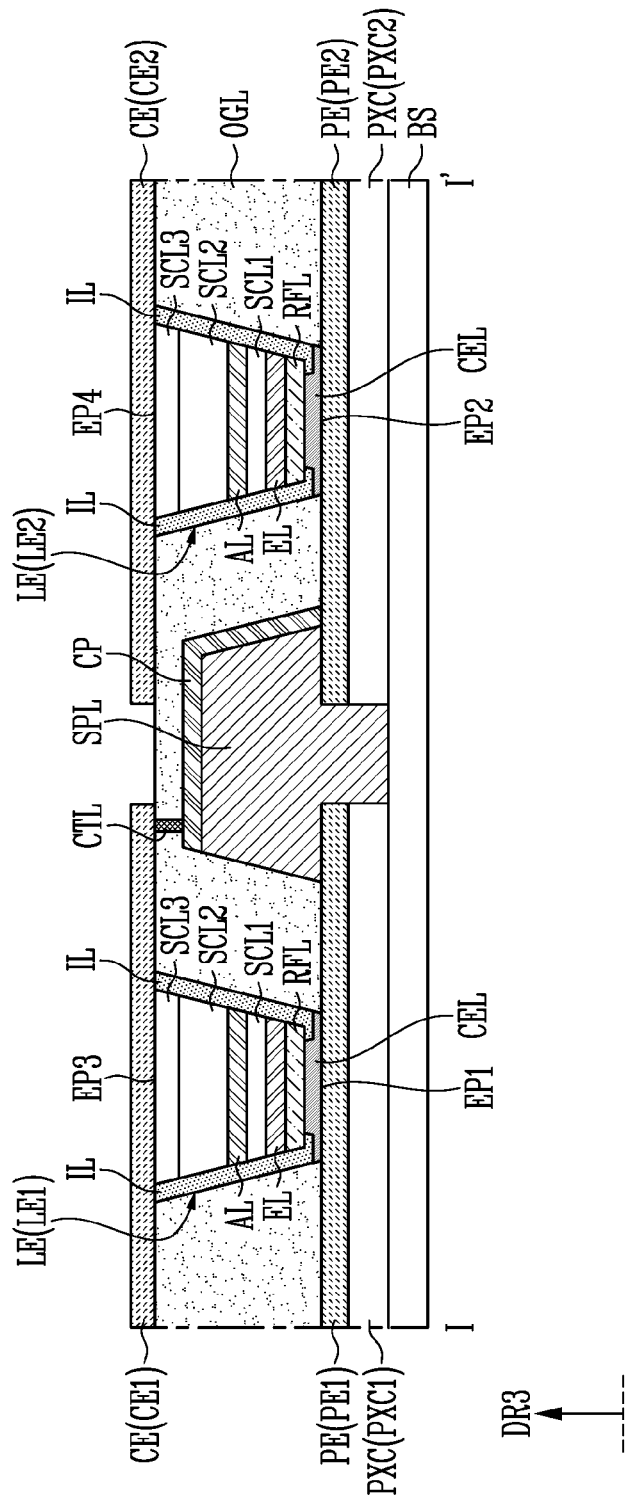

Referring to FIGS. 5 and 12, a first common electrode CE1 overlapping one of the first pixel electrodes PE1 and electrically connected to the contact layer CTL, and a second common electrode CE2 overlapping one of the second pixel electrodes PE2 may be formed. The first common electrode CE1 and the second common electrode CE2 may be formed through a deposition process. Accordingly, the light emitting elements provided to each of the first pixels PX1 disposed in the first display area DA1 (refer to FIG. 1) may be electrically connected in parallel between a voltage source and the first common electrode, and the light emitting elements provided to each of the second pixels PX2 disposed in the second display area DA2 (refer to FIG. 1) may be electrically connected in parallel between a voltage source and the second common electrode CE2. Also, the first common electrode CE1 may be electrically connected to one of the second pixel electrodes PE2 through the contact layer CTL and the conductive pattern CP. Accordingly, the first light emitting elements LE1 provided to each of the first pixels PX12 adjacent to the second display area DA2 (refer to FIG. 1) and the second light emitting elements LE2 provided to each of the second pixels PX21 adjacent to the first display area DA1 (refer to FIG. 1) may be electrically connected to each other in series.

Figure 13:
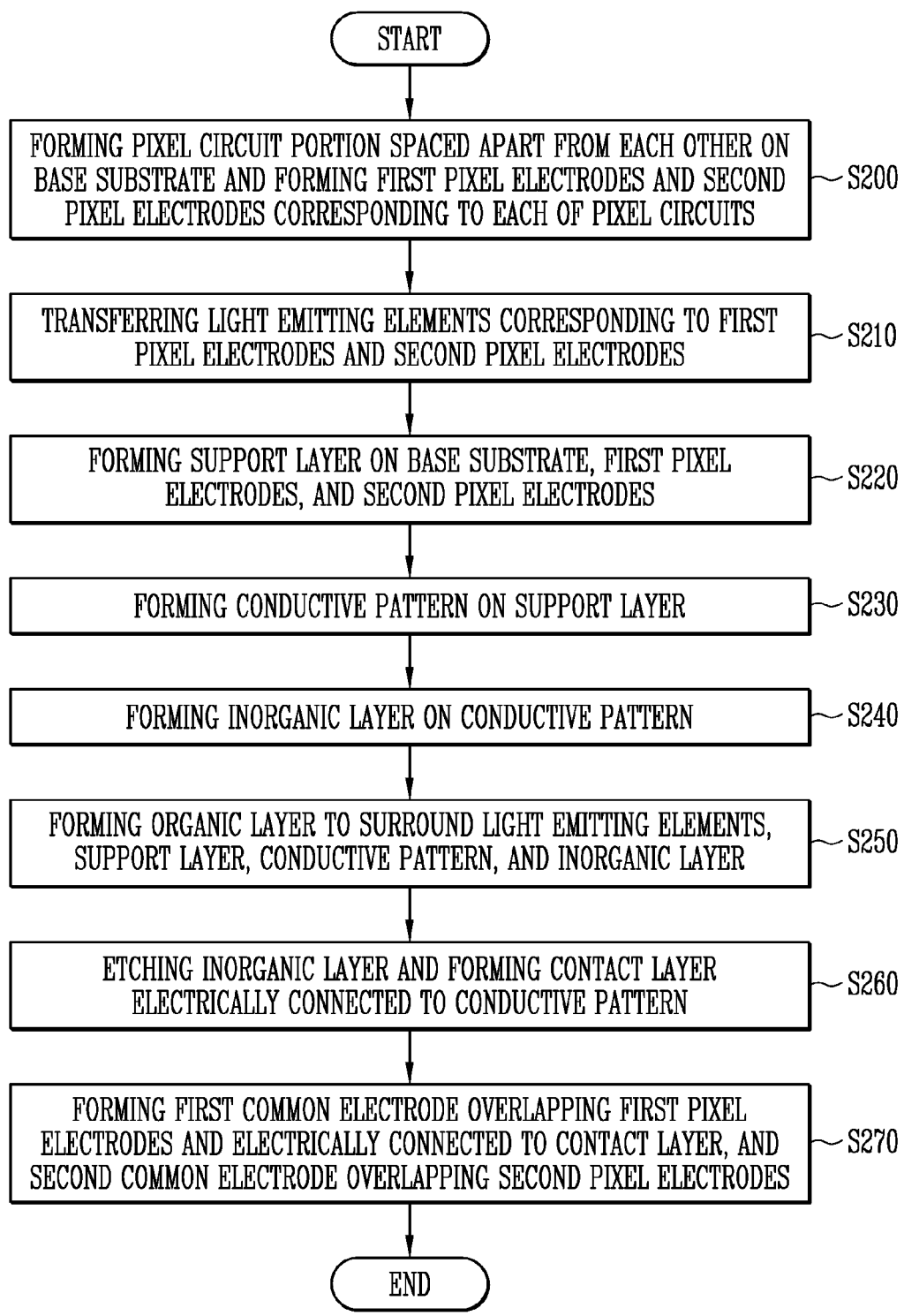
FIG. 13 is a flow chart for explaining a manufacturing method of a display device in accordance with an embodiment of FIG. 4.

FIG. 13 is a flow chart for explaining a manufacturing method of a display device according to an embodiment of FIG. 4, and FIGS. 14 to 17 are schematic diagrams for explaining the manufacturing method of the display device according to the embodiment of FIG. 4. In relation to FIGS. 13 to 17, subject matter overlapping that of FIGS. 5 to 12 will be briefly described or omitted.

Referring to FIG. 13, a manufacturing method of a display device according to an embodiment may include forming pixel circuits of pixel circuit portion spaced apart from each other on a base substrate and forming first pixel electrodes and second pixel electrodes corresponding to each of the pixel circuits (S200), transferring light emitting elements corresponding to the first pixel electrodes and the second pixel electrodes (S210), forming a support layer on the base substrate, the first pixel electrodes, and the second pixel electrodes (S220), forming a conductive pattern on the support layer (S230), forming an inorganic layer on the conductive pattern (S240), forming an organic layer to surround the light emitting elements, the support layer, the conductive pattern, and the inorganic layer (S250), etching the inorganic layer and forming a contact layer electrically connected to the conductive pattern (S260), and forming a first common electrode overlapping the first pixel electrode and electrically connected to the contact layer, and a second common electrode overlapping the second pixel electrode (S270).

Steps S200 to S230 of FIG. 13 may correspond to steps S100 to S130 of FIG. 5 and described above. For example, step S200 may be substantially the same as step S100, step S210 may be substantially the same as step S110, step S220 may be substantially the same as step S120, and step S230 may be substantially the same as step S130.

Figure 14:
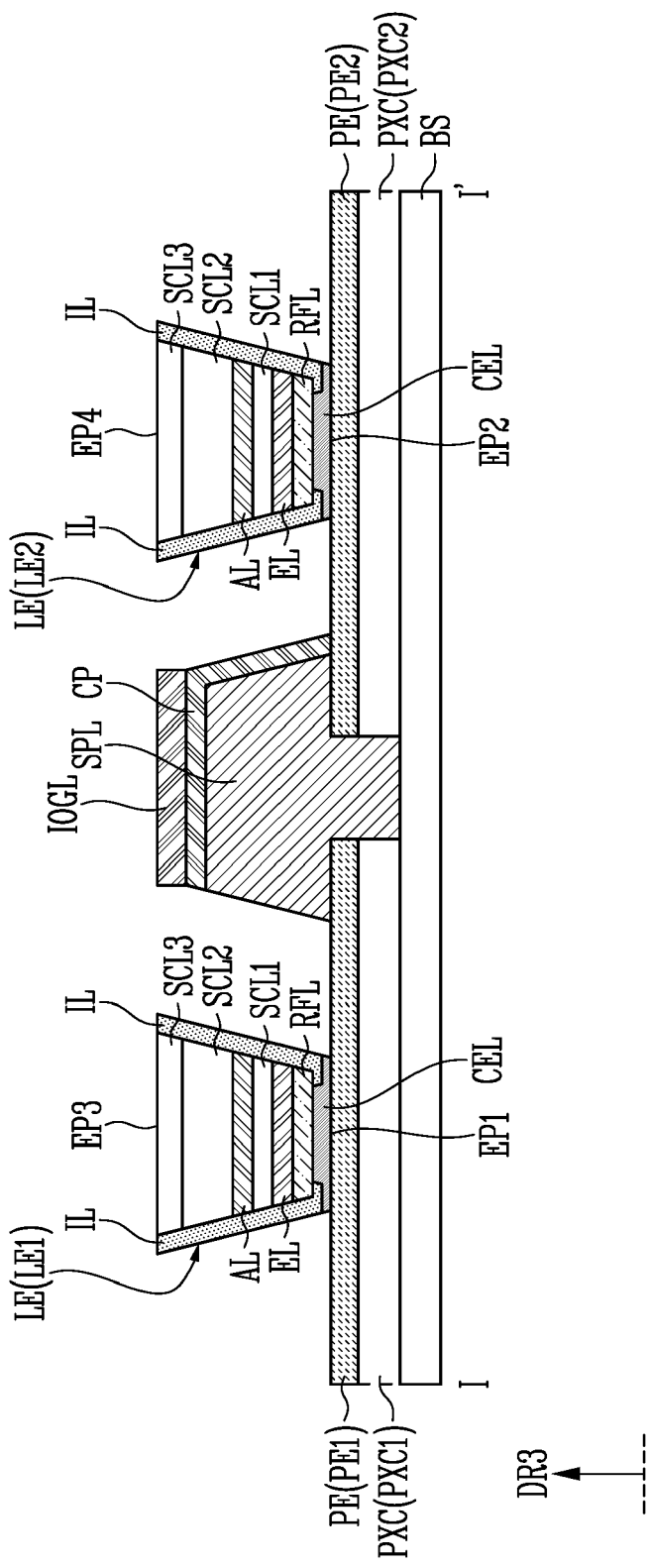
FIGS. 14, 15, 16 and 17 are schematic diagrams for explaining the manufacturing method of the display device in accordance with an embodiment of FIG. 4.

Referring to FIGS. 13 and 14, an inorganic layer IOGL may be formed on a conductive pattern CP (S240). According to an embodiment, the inorganic layer IOGL may be formed to cover an upper surface of the conductive pattern CP. However, the disclosure may not be limited thereto. For example, the inorganic layer IOGL may be formed on a portion of the conductive pattern CP corresponding to a location where a contact layer CTL is to be formed. The inorganic layer IOGL may be formed up to the height of light emitting elements LE. The inorganic layer IOGL may be formed through a deposition process.

Figure 15:
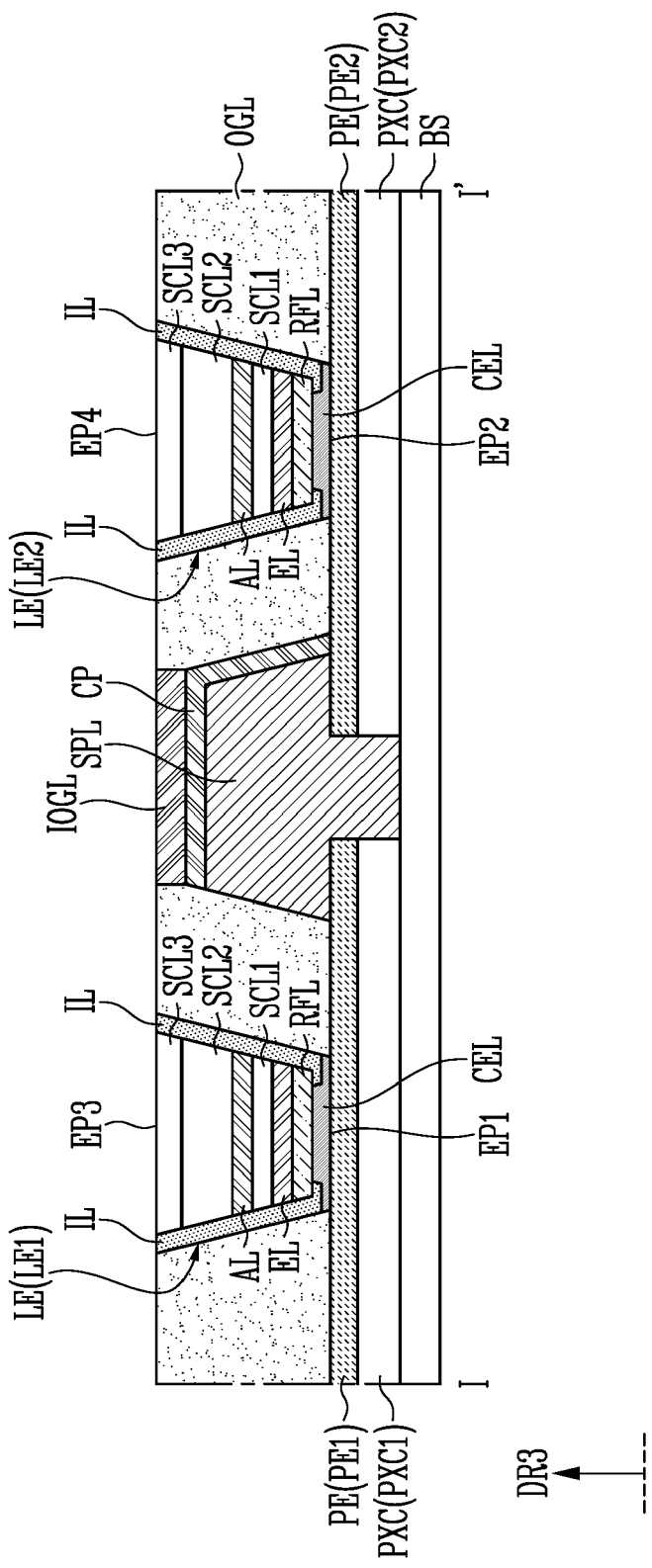

Referring to FIGS. 13 and 15, an organic layer OGL may be formed to surround the light emitting elements LE, the support layer SPL, the conductive pattern CP, and the inorganic layer IOGL (S250). Step S250 may be substantially the same as step S140 described above except that the organic layer OGL on the conductive pattern CP is replaced with the inorganic layer IOGL.

Figure 16:
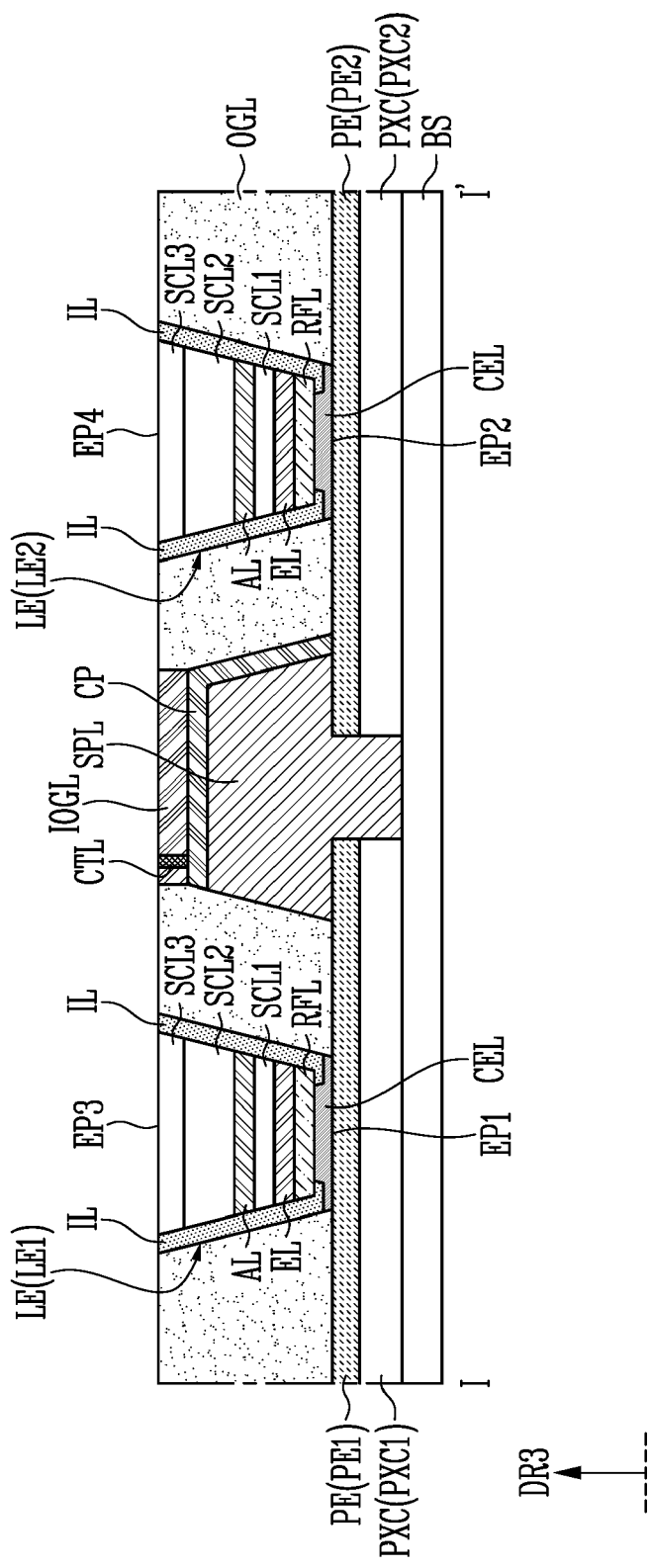

Referring to FIGS. 13 and 16, the contact layer CTL electrically connected to the conductive pattern CP may be formed by etching the inorganic layer IOGL (S260). According to an embodiment, a hole may be formed by etching a portion of the inorganic layer IOGL, and the contact layer CTL may be formed by depositing a conductive material in the hole. In the case of etching the inorganic layer IOGL, the hole may be readily formed compared to the case of etching the organic layer OGL, and the contact layer CTL may be formed uniformly. Therefore, process dispersion may be further reduced.

Figure 17:
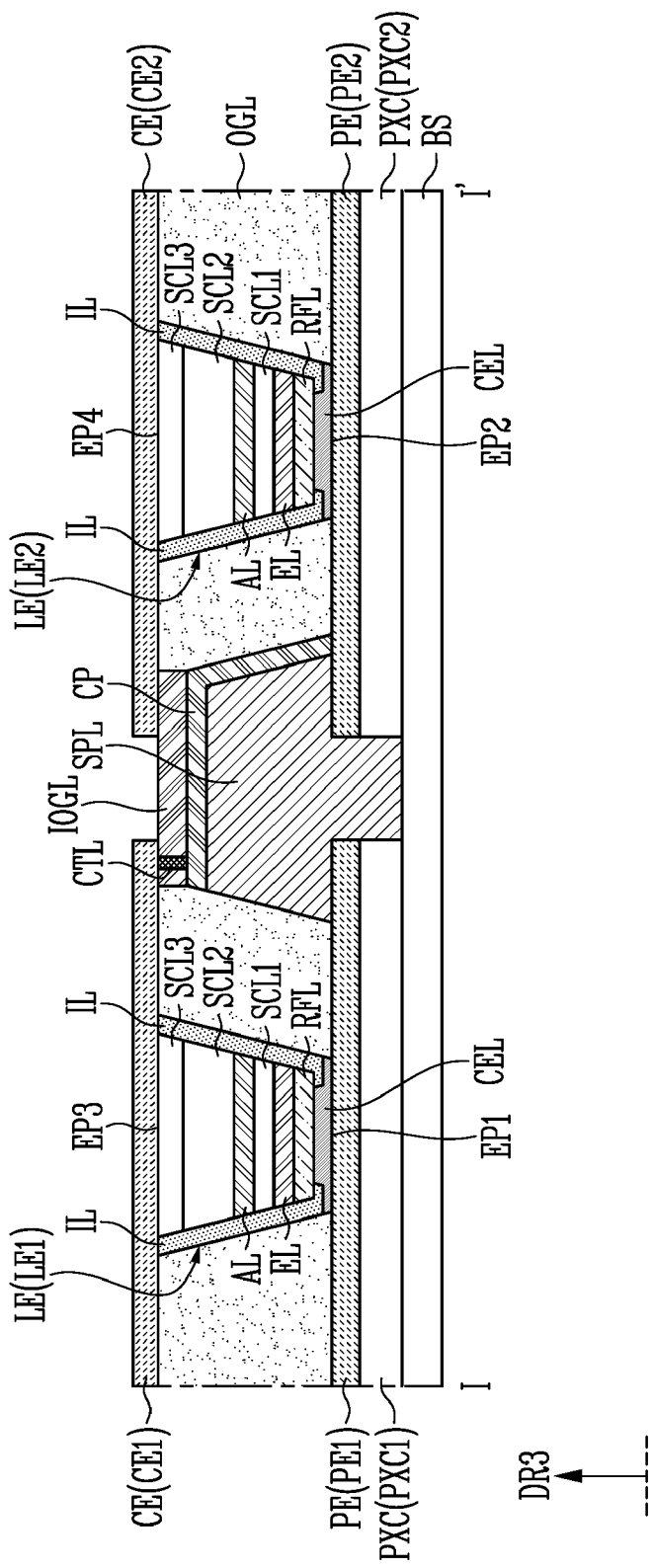

Referring to FIGS. 13 and 17, a first common electrode CE1 overlapping the first pixel electrodes PE1 and electrically connected to the contact layer CTL, and a second common electrode CE2 overlapping the second pixel electrodes PE2 may be formed. Step S270 may be substantially the same as step S160 described above except that the first common electrode CE1 and the second common electrode CE2 may contact the inorganic layer IOGL.

According to the embodiments, a structure in which light emitting elements may be electrically connected in series can be readily implemented by forming a support layer, a conductive pattern, and a contact layer between light emitting elements spaced apart from each other. By forming the support layer and the conductive pattern, an amount and depth of organic layer (or inorganic layer) removed in forming the contact layer may be reduced. Therefore, the process time may be shortened and the process dispersion may be improved.

Although the disclosure has been specifically described according to the above-described embodiments, it should be noted that the above-described embodiments are intended to illustrate the disclosure and not to limit the scope of the disclosure. Those of ordinary skill in the art to which the disclosure pertains will understand that various modifications are possible within the scope of the technical spirit of the disclosure. Therefore, the technical protection scope of the disclosure may not be limited to the detailed description described in the specification, but should be determined by the appended claims. All changes or modifications derived from the meaning and scope of the claims and their equivalents should be construed as being included in the scope of the disclosure.

What is claimed is:

1. A display device comprising:
   a plurality of first light emitting elements disposed between a plurality of first pixel electrodes and a first common electrode overlapping at least a portion of the plurality of first pixel electrodes;
   a plurality of second light emitting elements disposed between a plurality of second pixel electrodes and a second common electrode overlapping at least a portion of the plurality of second pixel electrodes, the plurality of second pixel electrodes being spaced apart from the first pixel electrodes;
   a support layer disposed between the plurality of first light emitting elements and the plurality of second light emitting elements and having a height;
   a conductive pattern disposed on the support layer;
   a contact layer having an end electrically connected to the first common electrode and another end electrically connected to the conductive pattern; and
   an organic layer surrounding the plurality of first light emitting elements, the plurality of second light emitting elements, the conductive pattern, and the support layer, the organic layer having a hole corresponding to the contact layer,
   wherein the contact layer fills the hole disposed in the organic layer at a location overlapping the support layer in a plan view, and
   wherein the organic layer is disposed between the conductive pattern and each of the first common electrode and the second common electrode in a thickness direction of the display device.

2. The display device of claim 1, wherein the support layer overlaps at least a portion of the first common electrode.

3. The display device of claim 1, wherein the height is smaller than heights of ones of the plurality of first light emitting elements and ones of the plurality of second light emitting elements.

4. The display device of claim 1, wherein the support layer includes an organic material.

5. The display device of claim 1, wherein an end of the conductive pattern is electrically connected to the contact layer and another end of the conductive pattern is electrically connected to one of the plurality of second pixel electrodes.

6. The display device of claim 1, wherein the conductive pattern includes a metal.

7. The display device of claim 1, wherein the first common electrode is electrically connected to one of the plurality of second pixel electrodes through the contact layer and the conductive pattern.

8. The display device of claim 1, further comprising:
   an inorganic layer disposed on the conductive pattern and having a hole corresponding to the contact layer.

9. The display device of claim 8, further comprising:
   an organic layer surrounding the plurality of first light emitting elements, the plurality of second light emitting elements, the inorganic layer, the conductive pattern, and the support layer.

10. The display device of claim 1, wherein each of the plurality of first light emitting elements and each of the plurality of second light emitting elements includes:
    a first semiconductor layer including a semiconductor of a first type;
    a second semiconductor layer including a semiconductor of a second type different from the first type;
    a third semiconductor layer disposed on the second semiconductor layer and including an undoped semiconductor of the second type;
    an active layer disposed between the first semiconductor layer and the second semiconductor layer;
    an electrode layer disposed on the first semiconductor layer;
    a reflective layer disposed on the electrode layer; and
    a connection electrode layer disposed on the reflective layer.

11. The display device of claim 1, wherein the support layer supports and is overlapped in a plan view by each of the conductive pattern and the contact layer.

12. The display device of claim 1, wherein
    the display device includes a display panel that includes a display area surrounded by a non-display area,
    the display area includes a first display area spaced apart from a second display area by a boundary,
    the plurality of first light emitting elements are disposed in the first display area,
    the plurality of second light emitting elements are disposed in the second display area, and
    the support layer is disposed in the boundary.

13. The display device of claim 12, wherein only ones of the plurality of first light emitting elements disposed adjacent to the boundary are electrically connected in series with ones of the second light emitting elements.

14. The display device of claim 1, wherein the first common electrode and the second common electrode do not share a same electrical node.

* * * * *